(12) United States Patent
Lang

(10) Patent No.: US 10,446,787 B2
(45) Date of Patent: Oct. 15, 2019

(54) METHOD FOR PRODUCING A BENT ORGANIC LIGHT-EMITTING DIODE AND BENT ORGANIC LIGHT-EMITTING DIODE

(71) Applicant: OSRAM OLED GmbH, Regensburg (DE)

(72) Inventor: Erwin Lang, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/777,176

(22) PCT Filed: Oct. 4, 2017

(86) PCT No.: PCT/EP2017/075169
§ 371 (c)(1),
(2) Date: May 17, 2018

(87) PCT Pub. No.: WO2018/072999
PCT Pub. Date: Apr. 26, 2018

(65) Prior Publication Data
US 2018/0351128 A1     Dec. 6, 2018

(30) Foreign Application Priority Data

Oct. 20, 2016    (DE) .................... 10 2016 119 987

(51) Int. Cl.
*H01L 51/52*     (2006.01)
*H01L 51/00*     (2006.01)
(Continued)

(52) U.S. Cl.
CPC .......... *H01L 51/524* (2013.01); *F21S 43/145* (2018.01); *F21V 17/101* (2013.01); *F21V 23/06* (2013.01); *H01L 51/0097* (2013.01); *H01L 51/5203* (2013.01); *H01L 51/56* (2013.01); *F21W 2103/20* (2018.01); *F21W 2103/35* (2018.01); *F21W 2103/45* (2018.01); *F21Y 2115/15* (2016.08); *H01L 2251/5361* (2013.01)

(58) Field of Classification Search
None
See application file for complete search history.

(56) References Cited

U.S. PATENT DOCUMENTS

| | | |
|---|---|---|
| 9,752,759 B2 | 9/2017 | Ito et al. |
| 2005/0003578 A1* | 1/2005 | Wu ..................... H01L 27/3288 438/108 |

(Continued)

FOREIGN PATENT DOCUMENTS

| | | |
|---|---|---|
| DE | 102015203761 A1 | 9/2015 |
| JP | 2016134340 A | 7/2016 |
| WO | 2015007574 A2 | 1/2015 |

*Primary Examiner* — J. E. Schoenholtz
(74) *Attorney, Agent, or Firm* — Slater Matsil, LLP

(57) ABSTRACT

A method for producing a bent organic light-emitting diode and a bent organic light-emitting diode are disclosed. In an embodiment the method includes providing an emitter unit having an organic layer sequence for generating radiation, providing at least one electrical connection piece, bending the at least one connection piece and the emitter unit into a curved shape and subsequently mechanically fixedly and permanently connecting the at least one connection piece to the emitter unit so that the curved shape is permanently maintained.

13 Claims, 6 Drawing Sheets

(51) Int. Cl.
*F21S 43/145*     (2018.01)
*F21V 17/10*      (2006.01)
*F21V 23/06*      (2006.01)
*H01L 51/56*      (2006.01)
*F21Y 115/15*     (2016.01)
*F21W 103/35*     (2018.01)
*F21W 103/20*     (2018.01)
*F21W 103/45*     (2018.01)

(56) References Cited

U.S. PATENT DOCUMENTS

| | | |
|---|---|---|
| 2012/0262929 A1 | 10/2012 | Knapp et al. |
| 2013/0026513 A1* | 1/2013 | Aurongzeb ............. F21V 1/146 257/98 |
| 2014/0340609 A1 | 11/2014 | Taylor et al. |
| 2015/0280152 A1* | 10/2015 | Iwagaki .................. H01L 51/52 257/40 |
| 2015/0311471 A1 | 10/2015 | Lang et al. |
| 2016/0218166 A1 | 7/2016 | Fukuma et al. |
| 2017/0062753 A1* | 3/2017 | Lee .......................... B60Q 1/04 |
| 2017/0294610 A1* | 10/2017 | Sasaki ................. H01L 27/3276 |

* cited by examiner

METHOD FOR PRODUCING A BENT ORGANIC LIGHT-EMITTING DIODE AND BENT ORGANIC LIGHT-EMITTING DIODE

This patent application is a national phase filing under section 371 of PCT/EP2017/075169, filed Oct. 4, 2017, which claims the priority of German patent application 10 2016 119 987.7, filed Oct. 20, 2016, each of which is incorporated herein by reference in its entirety.

TECHNICAL FIELD

A method for producing a bent organic light-emitting diode is provided. Furthermore, such an organic light-emitting diode is provided.

SUMMARY OF THE INVENTION

Embodiments provide a bent organic light-emitting diode. Further embodiments provide an organic light-emitting diode which can be produced in an efficient manner and can be reliably electrically contactable.

According to at least one embodiment, the method is used to produce a bent organic light-emitting diode. It is possible that a sag and/or a curvature can be changed in a targeted manner in the finished organic light-emitting diode, or, preferably, that the finished bent organic light-emitting diode assumes a defined, three-dimensional and invariable shape.

According to at least one embodiment, the method comprises the step of providing at least one emitter unit. The emitter unit comprises at least one organic layer sequence for generating radiation, in particular for generating visible light, such as colored light or white light. This means that the radiation generation in the emitter unit is based on organic materials. For example, the emitter unit is constructed like the light-generating unit in document U.S. Publication No. 2015/0311471 A1 or in International Publication No. WO 2015/007574 A2. The disclosure content with regard to the light-generating unit of these documents is incorporated by reference.

According to at least one embodiment, the emitter unit is mechanically flexible when being provided and can thus be bent in a non-destructive and intended manner.

According to at least one embodiment, an electrical connection piece is provided. The electrical connection piece is designed to be attached to the emitter unit and to electrically contact the emitter unit. In particular, an electrical connection is produced between the emitter unit and an external power supply via the connection piece.

According to at least one embodiment, the at least one electrical connection piece is mechanically flexible. For example, the connection piece or the connection pieces is/are in each case a flexible printed circuit board, also referred to as a flex PCB. The connection piece preferably comprises electrical conductor tracks and electrical contact surfaces and optionally a plug. The connection piece can also be bent in a mechanically flexible and non-destructive and intended manner when being provided.

According to at least one embodiment, the method comprises the step of bending at least the at least one connection piece and the emitter unit. By bending, the at least one connection piece and the emitter unit and, if necessary, further components of the organic light-emitting diode, are brought into the desired curved shape. It is possible for the shape of the connection piece and/or the emitter unit to be no more or not significantly changed after bending.

According to at least one embodiment, at least one sensor is applied to the organic light-emitting diode and/or to the holder. The sensor or sensors is/are configured, for example, to measure a temperature and/or a luminance of the organic light-emitting diode and, if necessary, to enable a readjustment of the operating parameters of the organic light-emitting diode. Further electronic components such as capacitors, control circuits, fuses or identifiers such as RFIDs can also be applied.

According to at least one embodiment, the method comprises the step of mechanically fixedly and permanently connecting the at least one connection piece to the emitter unit. The connecting preferably takes place after bending. For example, the connecting is carried out by means of adhesive bonding. In the intended use and during the assembly of the organic light-emitting diode, the connection piece and the emitter unit therefore do not become detached from one another.

According to at least one embodiment, the joining of the emitter unit to the at least one connection piece is carried out in such a way that the curved shape is permanently maintained after the joining. This means, in particular, that, after the step of connecting, the organic light-emitting diode has the desired bent, final shape and this curved shape is fixed and maintained without any additional measures. Alternatively, it is possible that, for example, during assembly or during installation of the organic light-emitting diode, a further deformation occurs, for instance a further bending or cutting.

In at least one embodiment, the method is configured for producing a bent organic light-emitting diode and comprises the following steps, preferably in the order specified: A) providing an emitter unit having an organic layer sequence for generating radiation and providing at least one electrical connection piece, B) bending at least the connection piece and the emitter unit into a curved shape, and C) subsequently mechanically fixedly and permanently connecting the at least one connection piece to the emitter unit so that the curved shape is permanently maintained after step C).

For example, in the automobile industry there is a need for light sources which offer great design freedom. This is made possible in particular by flexible organic light-emitting diodes since these can be brought into three-dimensional shapes in order to offer new design possibilities. In this case, organic light-emitting diodes, OLEDs for short, are bent in a region of a luminous surface and in non-luminous regions, as long as the bending does not relate to electrical contact regions of the organic light-emitting diode. If, in conventional organic light-emitting diodes, a bending occurs in the electrical contact region, as a result of the bending tensile forces, compressive forces and/or shear forces permanently affect the electrical connection components. This leads, in particular in comparatively extreme conditions such as high atmospheric humidity, shocks, large temperature changes or vibrations, to a delamination or to a loss of the electrical contact. Such relatively adverse conditions exist, for example, when using organic light-emitting diodes in motor vehicles or in preparatory tests for this purpose.

With the method described here, the electrical connection piece can be attached to the emitter unit essentially without mechanical permanent stresses. Thus, narrow bending radii can be realized in the contact region, too. Thus, the organic light-emitting diode described here can satisfy the test conditions in the automobile sector, since compressive forces, tensile forces and/or shear forces on the electrical contacting are avoided or greatly reduced.

According to at least one embodiment, a holder is additionally provided in step A). In step C), the holder is mechanically fixedly and permanently connected to the emitter unit and the connection piece. The holder can be attached to the same side of the emitter unit as the connection piece. Alternatively, the at least one connection piece and the holder can be located on different sides of the emitter unit.

According to at least one embodiment, in step A) the holder has a bending stiffness higher by at least a factor of 10 or 100 or 1000 than that of the emitter unit and/or that of the connection piece. In other words, already in step A) the holder is mechanically rigid at least in relation to the emitter unit and to the connection piece. This means that the shape of the emitter unit mounted on the holder and of the connection piece can be defined by the holder. In other words, the holder predetermines the three-dimensional shape of the organic light-emitting diode.

According to at least one embodiment, the holder has a mean length and/or width which is at least 5 mm or 10 mm and/or at most 500 mm or 100 mm. Alternatively or additionally, the mean or maximum thickness of the holder is at least 0.5 mm or 1 mm and/or at most 5 mm or 10 mm. The holder is preferably made of a metal such as aluminum but can also be made of a plastic such as polycarbonate, of a thermoplastic or of a ceramic. The holder is produced, for example, by milling from the solid, by injection molding or by laser sintering.

It is possible for the holder to have an unchanged, constant thickness. Alternatively, the holder can be structured and in particular can have struts or ribs in order to achieve a high mechanical stiffness with low intrinsic weight.

According to at least one embodiment, the holder holds the bent emitter unit and the bent connection piece in shape after step C). Thus, it is possible for the holder to have the curved, final shape already in step A). Alternatively, it is possible for the holder to be also bent in step B). In step B), the bending of the connection piece, of the emitter unit and optionally of the holder can each be done independently of one another, also in different tools, or simultaneously and also in the same tool.

According to at least one embodiment, the emitter unit has a plurality of electrical contact regions on a first main side, in particular for an anode contact and a cathode contact. Preferably, all electrical contact regions are located on the first main side. If the emitter unit is divided into a plurality of separately electrically controllable emission regions, it is possible for a separate electrical contact region to be provided for each emission region. In the case of a single, contiguous emission region, preferably only exactly two electrical contact regions are present.

According to at least one embodiment, the connection piece extends across all contact regions. Thus, exactly one electrical connection piece is preferably provided, which has a plurality of contact surfaces, wherein preferably each of the contact regions of the connection piece is assigned to one of the contact regions of the emitter unit and vice versa.

According to at least one embodiment, in step B) the bending takes place also or only in the region of the contact regions. This means that a bend is present at the contact regions. A bending radius in the region of the contact regions preferably is locally or continuously 1 cm or less or 2 mm or less or 0.7 mm or less. This means that even kinks can be present in the contact regions. Alternatively or additionally, in the contact regions a normal vector to the associated contact region changes by at least 30° or 60° or 90°.

According to at least one embodiment, the first main side is an emission side of the emitter unit. This means that the generated radiation or the generated light is emitted at the first main side during normal operation of the organic light-emitting diode. Thus, it is possible for the emission of radiation or light to be restricted to the first main side. Alternatively, the emitter unit emits radiation on both main sides during operation.

According to at least one embodiment, the contact regions or at least some of the contact regions of the emitter unit each have a main extension direction. The main extension direction is, for example, a direction of a maximum extent or along a longest axis of symmetry of the respective contact region.

According to at least one embodiment, the main directions of extent of the contact regions in step A), that is to say especially in the case of the unbent, planar emitter unit, and/or after step B) or step C) are oriented parallel or approximately parallel to one another. In other words, it is possible for the main extension directions to point in the same direction.

According to at least one embodiment, in step B) a bending curve is oriented parallel to the main extension directions in the region of the contact regions, viewed in a plan view of the contact regions. This applies, for example, with a tolerance of at most 30° or 15° or 5°. Alternatively, the bending curve is oriented perpendicular to the main extension directions, in turn, for example, with a tolerance of at most 30° or 15° or 5°. The bending curve is in particular the curve along which a maximum direction change of a normal vector of the component to be bent takes place during the bending. In particular, the bending curve runs parallel to the neutral axis.

According to at least one embodiment, a bending radius between adjacent contact regions is greater than in the contact regions themselves. In this case, the bending curve is oriented parallel or approximately parallel to the main extension directions, for example, viewed in a plan view of the contact regions. Alternatively or additionally, it is possible for a point with a minimum bending radius to lie in the region between adjacent contact regions. It is also possible for a region having a minimum bending radius to lie completely or partly in the contact regions.

According to at least one embodiment, the connection piece or the connection pieces has/each have at least one point with a recess and/or with a reduced thickness. This point is preferably located between adjacent contact regions. Furthermore, it is possible for this point with the recess and/or with the reduced thickness to be located in a region with a minimum radius of curvature of the emitter unit. In this case, the at least one connection piece preferably completely covers the associated electrical contact regions of the emitter unit. The point of reduced thickness can overlap with the contact regions or can lie completely beside the contact regions.

According to at least one embodiment, the contact regions are configured for a current distribution across the emitter unit. For this purpose, the contact regions preferably extend along one or along two directions, for example, to at least 40% or 60% or 80% of a mean extent over the emitter unit. Uniform current impression into the emitter unit is possible via such contact regions. The electrical connection piece and its contact surfaces can extend in the same manner across the emitter unit.

According to at least one embodiment, the contact regions are restricted to an edge region of the emitter unit. The edge region means, for example, a region having a width of at most 10% or 5% of an extent in the direction perpendicular to the respective edge at which the edge region is located. For example, if the emitter unit has an extent of 20 cm in the direction perpendicular to the relevant edge, then the edge region has a width of, for example, at most 5% corresponding to 1 cm.

According to at least one embodiment, the minimum bending radius is present in the edge region. Alternatively or additionally, the minimum bending radius is present between the contact regions and the emission region of the emitter unit. As a result, it is possible for the organic light-emitting diode to be formed completely or almost completely by the emission region, and that the contact regions are bent away in such a way that they are not visible or can hardly be recognized, in a plan view of the emitter region.

According to at least one embodiment, the emitter unit and the connection piece are connected to one another in a planar and/or continuous manner. In particular, a contact layer is located over the whole area between the emitter unit and the connection piece. The emitter unit and the connection piece are mechanically connected to one another via the contact layer. The contact layer can completely cover the contact regions.

According to at least one embodiment, the contact layer is an electrically anisotropically conductive contact layer, also referred to as an anisotropic conductive film or ACF for short. The contact layer is thus electrically conductive locally in each case only in the direction perpendicular to the emitter unit and/or to the connection piece. For example, the contact layer is a layer having an insulating matrix material into which electrically conductive particles are introduced. The contact layer is hardened, for example, by heating in combination with the action of pressure so that a connection is produced between the connection piece and the emitter unit.

According to at least one embodiment, the contact layer is an electrically conductive adhesive layer, for instance a layer made of an adhesive with metal particles. In particular, the contact layer is then formed from a paste containing silver particles. In this case, the contact layer can be isotropically electrically conductive.

According to at least one embodiment, the connection piece comprises one or more plugs. The at least one plug is designed to be connected to an end of the connection piece facing away from the emitter unit by means of a plug connection, which can be reversibly or permanently electrically and optionally also mechanically contacted. In other words, the electrical connection piece in the form of a flexible printed circuit board can produce a cable-like connection from the emitter unit to an external power supply.

According to at least one embodiment, the plug is not affected by steps B) or C). In other words, the plug itself is not or not significantly bent or clamped. This means that the plug can be mechanically decoupled in respect of bending due to its distance from the contact regions and from the emitter unit.

Furthermore, an organic light-emitting diode is specified. The organic light-emitting diode is produced using a method as indicated in connection with one or more of the above-mentioned embodiments. Features for the method are therefore also disclosed for the organic light-emitting diode and vice versa.

In at least one embodiment, the organic light-emitting diode comprises a mechanically rigid holder, which is not deformed or not significantly deformed during proper operation and during the intended mounting of the organic light-emitting diode. The organic light-emitting diode further comprises a curved emitter unit having an organic layer sequence for generating radiation and at least one bent electrical connection piece, to which the emitter unit is electrically connected. The holder, the emitter unit and the connection piece are permanently mechanically fixedly connected to one another so that the cited components do not become detached from one another in the intended use over the service life of the organic light-emitting diode.

In addition, the emitter unit and the connection piece are bent in the region of electrical contact regions of the emitter unit. At least in places, a bending radius of the emitter unit and of the connection piece, in particular at the contact regions, is 20 mm or less or 10 mm or less or 2 mm or less. The emitter unit and the connection piece each have a neutral axis and/or a neutral surface, in the same way as this can apply to the holder. This means that the emitter unit and the connection piece are bent independently of one another and therefore do not have a common neutral axis and/or a common neutral surface with regard to the bending.

The neutral axis and/or the neutral surface are also referred to as the zero line or the zero surface, in particular that line or intersection line or surface on or in the associated component the length of which does not change during bending. There is no or no significant tensile stress or compressive stress or shear stress in the neutral axis and/or the neutral surface. Thus, the neutral axis and/or the neutral surface are/is free of forces.

According to at least one embodiment, the organic light-emitting diode is designed as a rear light and/or as a brake light of a motor vehicle such as a car. In particular, the light-emitting diode is configured as a combined rear light and brake light. For this purpose, the organic light-emitting diode preferably emits red light, especially exclusively red light. Optionally, the light-emitting diode is also functionalized as a turn indicator or reversing light.

BRIEF DESCRIPTION OF THE DRAWINGS

A method described here and an organic light-emitting diode described here are explained in more detail below with reference to the drawing on the basis of exemplary embodiments. Identical reference signs indicate the same elements in the individual figures. However, no relationships to scale are illustrated; rather, individual elements can be represented with an exaggerated size in order to afford a better understanding.

In the Figures.

DETAILED DESCRIPTION OF ILLUSTRATIVE EMBODIMENTS

Figure 1A:
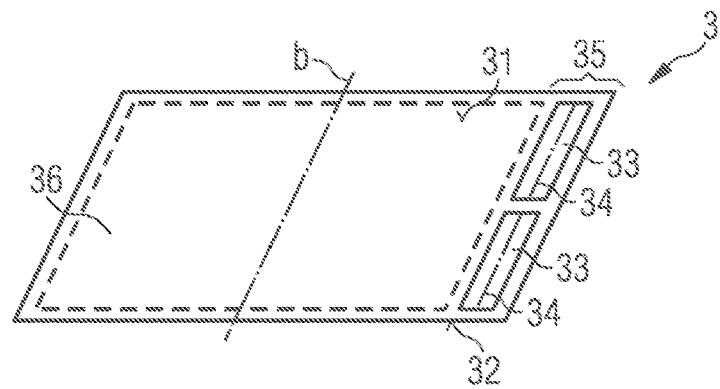
FIGS. 1A to 1C and 2A to 2C show schematic representations of methods described here for producing organic light-emitting diodes described here.
Figure 1B:
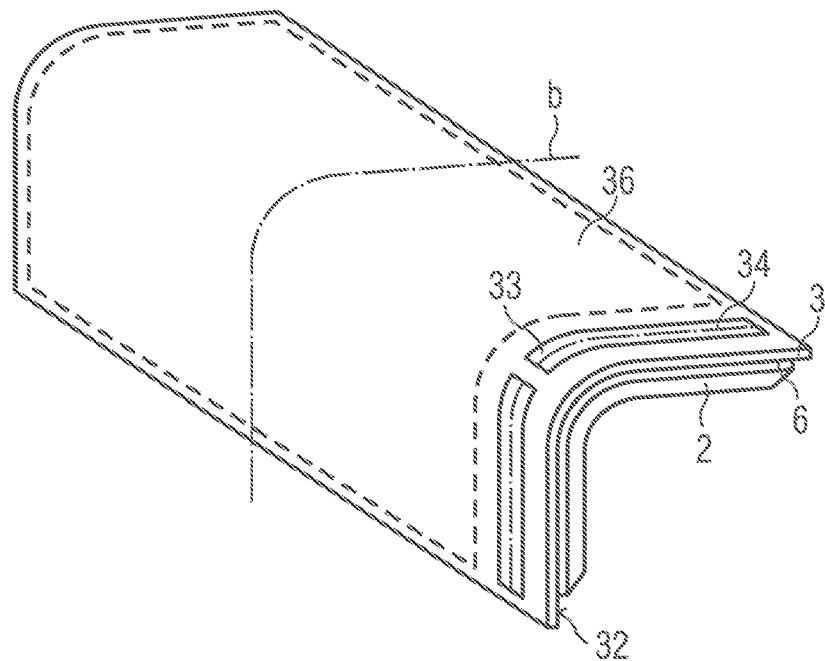

FIG. 1 schematically illustrates a method for producing a bent organic light-emitting diode 1. According to the perspective illustration in FIG. 1A, a flat emitter unit 3, which is not yet bent, is provided. The emitter unit 3 comprises an organic layer sequence so that radiation is generated from an emission region 36 on a first main side 31 of the emitter unit 3 during operation. The emission region 36 is symbolized in FIGS. 1A and 1B by a dashed line. Preferably, no radiation is emitted on a second main side 32 opposite the first main side 31.

Furthermore, the emitter unit 3 has two electrical contact regions 33. The electrical contact regions 33 are located in an edge region 35 of the first main side 31, whereas the second main side 32 is free of contact regions. In a plan view, the contact regions 33 are formed by elongated rectangles. The contact regions 33 each have a main direction of extension 34 which is formed by a longitudinal axis of symmetry.

FIG. 1B shows that the emitter unit 3 has been bent along a bending curve b. The bending curve b is oriented approximately parallel to the main extension directions 34 of the electrical contact regions 33, in a plan view of the latter. A region with a maximum curvature and thus with a minimum bending radius lies in the direction perpendicular to the bending curve b between the two contact regions 33.

The bent emitter unit 3 is fastened to a holder 2 in FIG. 1B. The holder 2 is, for example, a bent metal sheet or a plastic part, for example, produced by means of injection molding. The holder 2 lies opposite the emission region 36 and is located on the second main side 32.

The holder is preferably fastened to the emitter unit via a connecting means 6. The connecting means 6 is, for example, a double-sided adhesive tape, also referred to as pressure-sensitive adhesive or PSA. The connecting means 6 preferably extends for the most part, for example, at least 80% or 90% or over the whole area, between the holder 2 and the emitter unit 3.

Figure 1C:
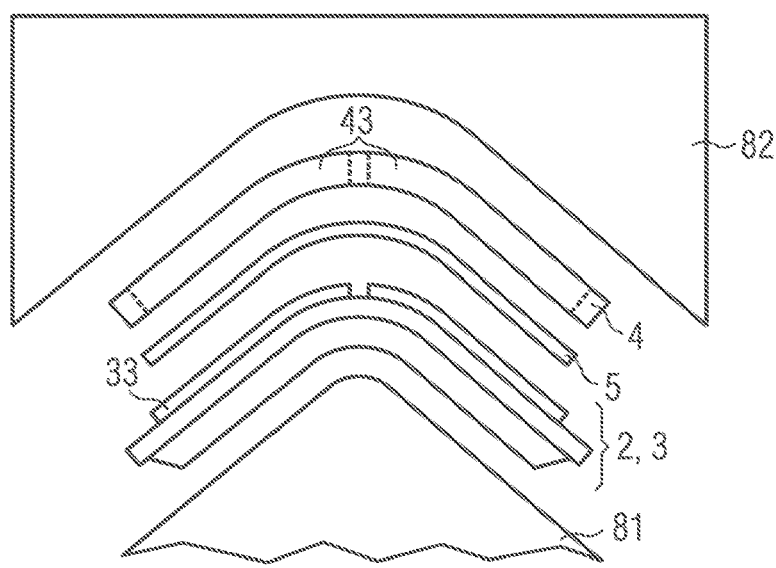

In FIG. 1C, the step of connecting the emitter unit to an electrical connection piece 4 is illustrated in a sectional view, wherein the connection piece 4 is also bent. The connection and the final shaping are carried out between a first tool part 81 and a second tool part 82, which have the shape desired for the light-emitting diode 1. The first tool part 81 is, for example, a holder or temperature-controlled holder, also referred to as a bond jig. The second tool part 82 serves in particular as a counter-holder and can be designed as a sonotrode. It is possible that, by means of the second tool part 82, a heating and/or a pressure exertion and/or an ultrasonic impression for connecting takes place.

The composite of the holder 2 and the emitter unit 3 from FIG. 1B is applied, for example, to the first tool part 81. The electrical connection piece 4 is located on the second tool part 82. The connection piece 4 is preferably a flexible printed circuit board, also referred to as a flex PCB. The connection piece 4 contains a plurality of electrical contact surfaces 43 and conductor tracks, which are only schematically indicated by dashed lines in FIG. 1C. The contact surfaces 43 are associated with the contact regions 33 in a one-to-one manner. On a side facing away from the emitter unit 3, the contact surfaces 43 of the connection piece 4 are preferably completely covered by an electrically insulating material of the connection piece 4.

An electrically anisotropically conductive contact layer 5, also referred to as ACF, is introduced between the connection piece 4 and the emitter unit 3. The contact layer 5 is introduced as a contiguous, continuous layer. The contact layer 5 is electrically conductive only in the direction perpendicular to the contact regions 33 and not along a longitudinal direction of the contact layer 5. It is possible that the contact layer 5 is hardened in a two-stage process, for example, in a pre-assembly step at a relatively low temperature between 90° C. and 130° C. or between 110° C. and 120° C., and subsequently in a final assembly step at a relatively high temperature, for example, between 130° C. and 300° C. or 150° C. to 270° C., depending on the material used in each case, and under the action of pressure. Thus, the higher temperature is particularly preferably at least 30° C. or 50° C. or 100° C. above the lower temperature, wherein temperature ramps can also be used. For example, the two temperatures are 110° C. and 270° C. By means of the contact layer 5, a mechanical and electrical permanent connection between the emitter unit 3 and the holder 2 and the connection piece 4 is achieved.

Thus, in the method of FIG. 1, the emitter unit 3 and the connection piece 4 are first bent and deformed. The connection piece 4 is just afterwards attached to the emitter unit 3, preferably by means of the contact layer 5. Thus, bent organic light-emitting diodes 1 can also be produced with narrow bending radii in the contact regions 33, wherein the connection piece 4 is preferably a flexible printed circuit board and an electrically anisotropically conductive contact layer 5 is used. Hence, a high degree of robustness and reliability of bent organic light-emitting diodes 1 can also be achieved under test conditions in the automobile sector. This allows greater design freedom in the development of attractive lights in the automobile sector.

Furthermore, larger contact regions are made possible so that a reduced contact resistance can also be achieved in the curved regions. By increasing a contact cross-sectional area between the emitter unit 3 and the connection piece 4, in particular by means of the contact layer 5, a greater adhesive force can be applied between these components 3, 4 and thus an increased mechanical resistance force. The component produced with the step of FIG. 1C in the form of the bent organic light-emitting diode 1 is preferably dimensionally stable and does not or not significantly change its outer shape after removal from the tool parts 81, 82.

Figure 2A:
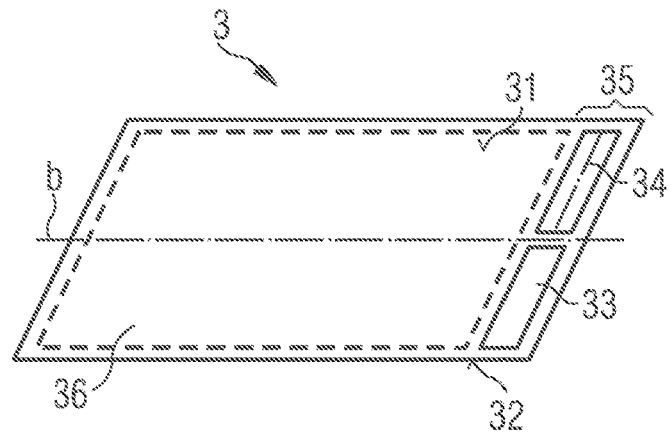
Figure 2B:
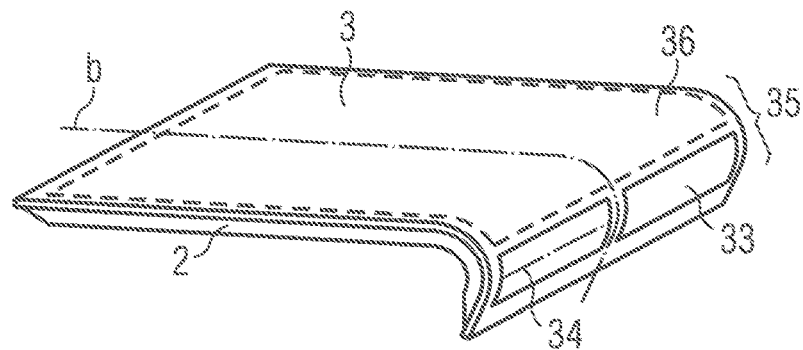
Figure 2C:
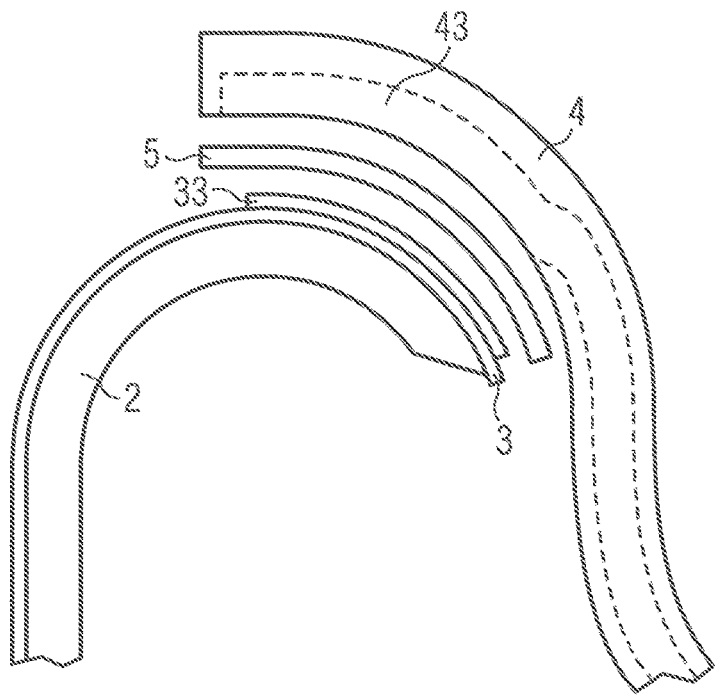

A further method is illustrated in FIG. 2. See the perspective representations in FIGS. 2A and 2B and the sectional representation in FIG. 2C. In contrast to FIG. 1, the bending curve b is oriented perpendicular to the main extension direction 34 of the contact regions 33, in a plan view of the contact regions 33. A region of maximum curvature and with a minimum radius of curvature lies between the emission region 36 and the contact regions 33 in the edge region 35. Again, the shape of the bent emitter unit 3 is fixed by the holder 2.

According to FIG. 2C, the connection piece 4 is fastened to the composite comprising the emitter unit 3 and the holder 2 via the electrically anisotropically conductive contact layer 5. To simplify the representation, the bending tool from FIG. 1C is not shown in FIG. 2C. The contact surfaces 43 of the connection piece 4 are applied directly to the contact layer 5, which in turn is pressed directly against the contact regions 33. The conductor tracks run within the connection piece 4 so that the conductor tracks of the connection piece 4 are not exposed. The same can also apply in all other exemplary embodiments.

Figure 3:
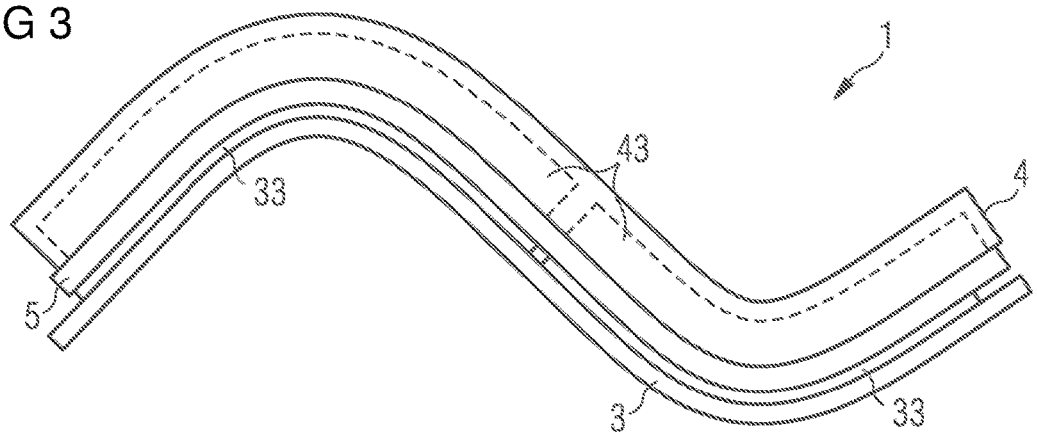
FIGS. 3 to 9 show schematic representations of exemplary embodiments of organic light-emitting diodes described here.

In FIG. 3, the finished bent light-emitting diode 1 is shown in a sectional representation, for example, produced using the methods of FIG. 1 or 2. Due to the production method, the connection piece 4 and the emitter unit 3 each have a neutral axis, viewed in cross section. Correspondingly, a further neutral axis can be present in the contact layer 5 and in the optionally present holder 2.

Viewed in cross section, the light-emitting diode is curved in an S-shape and has curvatures with different signs. In particular, the contact regions 33 are curved in opposite directions to one another, as is also true for the contact surfaces 43.

Figure 4:
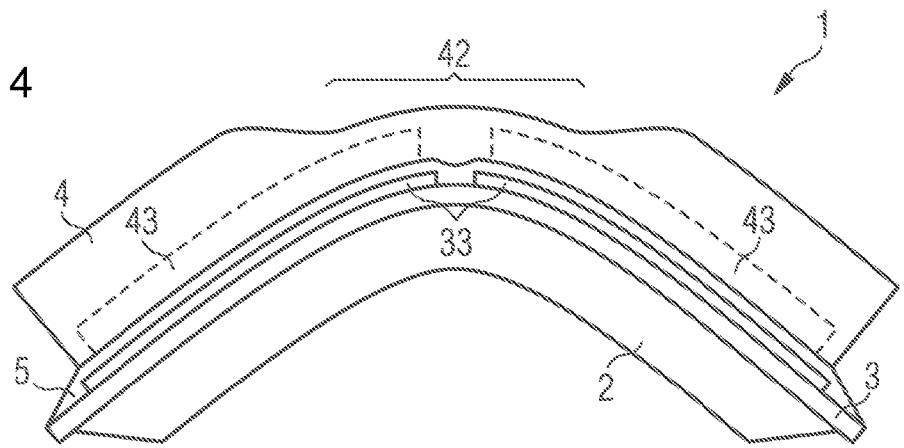

In the sectional view of FIG. 4, it can be seen that the light-emitting diode has a curvature with only one sign, viewed in cross-section. In a region of maximum curvature and with a minimum radius of curvature, which lies approximately in a boundary region between the two contact regions 33, the connection piece 4 has a point 42 with a reduced thickness. This facilitates bending of the connection piece 4. This point 42 extends partially onto the contact regions 33, viewed in a plan view perpendicular to the respective contact region 33.

Figure 5:
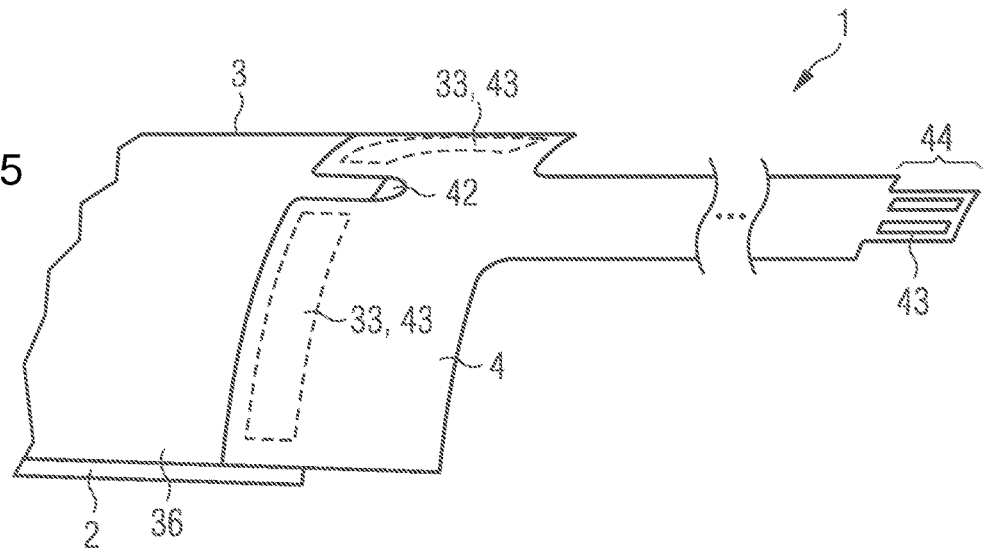

In the perspective representation of FIG. 5, it can be seen that a recess is provided at the point 42 with maximum curvature. The point 42 with the recess is located between the contact regions 33. Close to the emitter unit 3, the connection piece 4 extends completely across the width of the emitter unit 3.

In the direction away from the emitter unit 3, the connection piece 4 narrows and forms a ribbon-like, cable-like extension. In this case, the point 42 with the recess and the flat-band-like extension are preferably arranged symmetrically to a longitudinal axis of the emitter unit 3.

A plug 44 is preferably located on a side of the connection piece 4 facing away from the emitter unit 3. The contact surfaces 43 are exposed in the plug 44. The organic light-emitting diode 1 can be electrically contacted externally via the plug 44.

Such a plug and/or such a flat-band-like, cable-like extension are preferably also present in all other exemplary embodiments.

Figure 6:
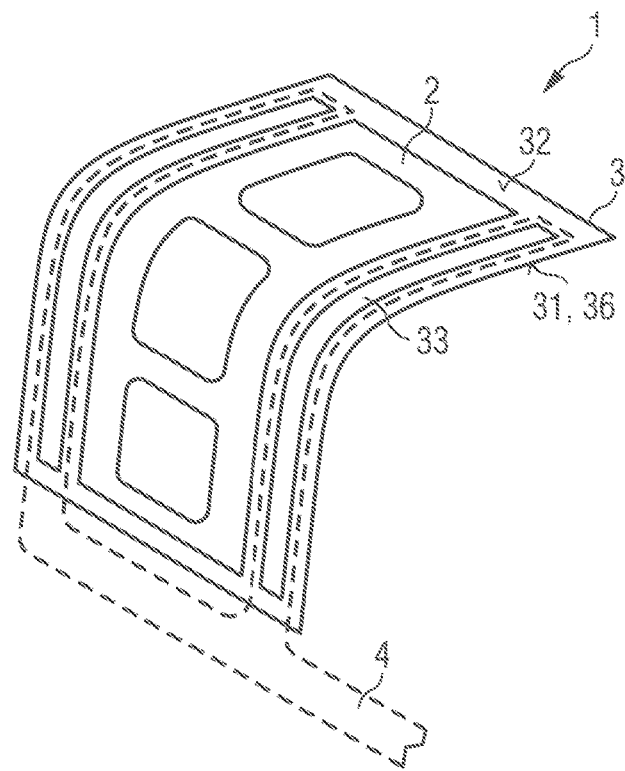

According to the perspective illustration of the organic light-emitting diode in FIG. 6, the connection piece 4, shown in dashed lines, and the holder 2 are located on the second main side 32 of the emitter unit 3. The holder 2 preferably covers only a part of the second main side 32. It is possible that the holder 2 has a plurality of recesses so that the holder 2 is provided with a honeycomb-shaped structure. Thus, high stability and low material usage and low weight can be achieved.

The electrical contact regions 33 of the emitter unit 3 extend completely or almost completely along longitudinal edges of the emitter unit 3 on the second main side 32 and are located next to the holder 2. Thus, a current spreading can be achieved via the emitter unit 3 by means of the contact regions 33. Seen in plan view, the F-shaped connection piece 4 completely covers the contact regions 33.

Figure 7:
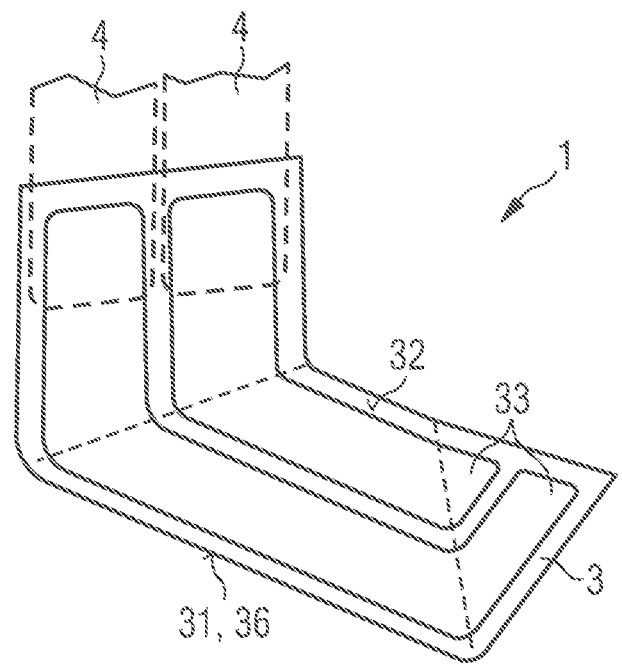

In the organic light-emitting diode 1 in the perspective representation of FIG. 7, the emitter unit 3 has bends in different directions. For example, the emitter unit is bent in the direction perpendicular to, and in the direction of 45° to a longitudinal axis.

As is also possible in all other exemplary embodiments, the two contact regions 33 cover one of the main sides, in the present case the second main side 32, completely or almost completely, for example, with a degree of coverage of at least 80% or 60%. In this way, a uniform current distribution can be achieved across the emitter unit 3.

Alternatively or additionally, as in all other exemplary embodiments, the electrical contact regions 33 can also be only partially covered by the at least one connection piece 4, wherein, as shown, a complete coverage of the contact regions 33 with the at least one connection piece 4 is preferably present. According to FIG. 7, as in all other exemplary embodiments, a plurality of connection pieces 4 are present. The two connection pieces 4 of FIG. 7 can also be replaced by a single connection piece.

Figure 8:
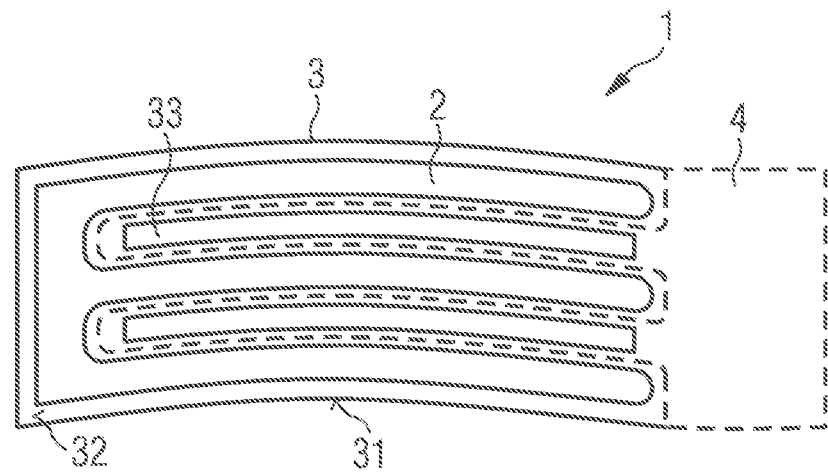

In the perspective illustration of the light-emitting diode 1 according to FIG. 8, the holder 2 and the contact regions 33 are designed in a finger-like manner. Viewed in a plan view, the holder 2 has the shape of a large E. Correspondingly, the connection piece 4 has a plurality of elongated fingers, which are located in each case between individual limbs of the holder 2 above the contact regions 33.

Figure 9:
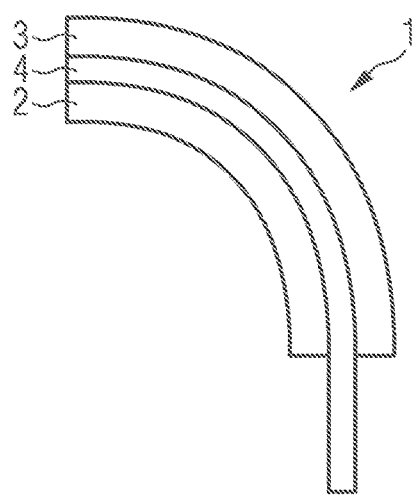

According to the sectional view of the light-emitting diode 1 in FIG. 9, the connection piece 4 is located between the holder 2 and the emitter unit 3. A corresponding arrangement can also be present in all other exemplary embodiments.

Figure 10:
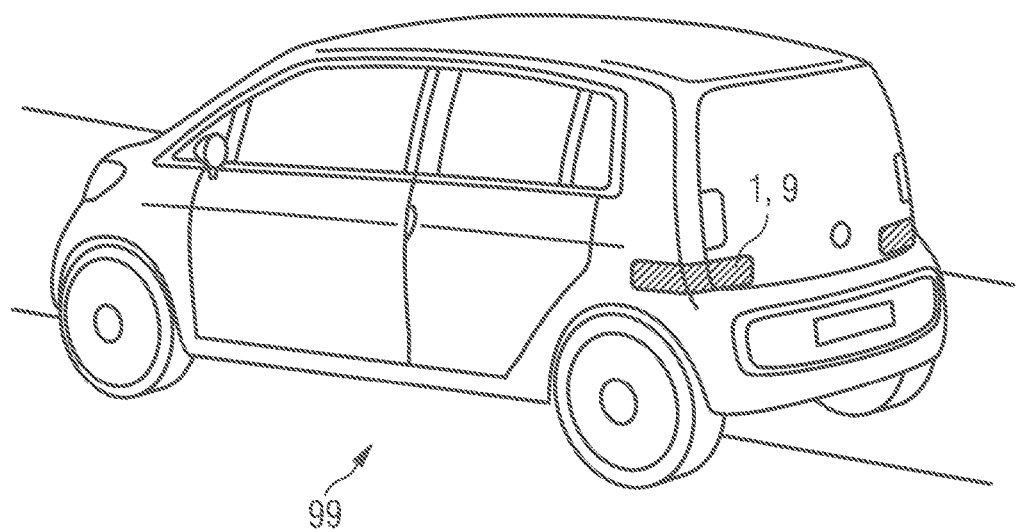
FIG. 10 shows a schematic perspective illustration of a car with an organic light-emitting diode described here as a rear light and a brake light.

The perspective representation of FIG. 10 illustrates that the bent organic light-emitting diode 1 is attached to a car 99 as a rear light 9. The organic light-emitting diode 1 preferably serves as a combined rear light and brake light and optionally also as a turn indicator. The light-emitting diode 1 extends over a plurality of main sides of the car 99, in particular onto a rear side and onto a side as well as across the edge connecting these surfaces.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims and exemplary embodiments.

The invention claimed is:

1. A method for producing a bent organic light-emitting diode, the method comprising:
    providing an emitter unit having an organic layer sequence for generating radiation;
    providing at least one electrical connection piece;
    providing a holder;
    bending the at least one connection piece and the emitter unit into a curved shape; and
    subsequently mechanically fixedly and permanently connecting the at least one connection piece to the emitter unit so that the curved shape is permanently maintained,
    wherein the holder having a bending stiffness that is at least by a factor of 10 higher than that of the emitter unit and of the connection piece, the emitter unit and the connection piece being mechanically fixedly and permanently connected to the holder.

2. The method according to claim 1,
    wherein the holder keeps the curved emitter unit and the bent connection piece in their form,
    wherein the holder is provided with a curved shape, and
    wherein the holder and the connection piece are located on different sides of the emitter unit.

3. The method according to claim 1,
    wherein the emitter unit and the connection piece are connected to one another in a planar and continuous manner by an electrically anisotropically conductive contact layer, and
    wherein the contact layer is locally electrically conductive only in a direction perpendicular to the emitter unit and to the connection piece.

4. The method according to claim 1,
    wherein the connection piece comprises a plug which is configured to be mechanically and electrically contacted externally by a plug-in connection on the connection piece on an end facing away from the emitter unit, and
    wherein the plug is not affected by bending and subsequently connecting.

5. A bent organic light-emitting diode comprising:
a mechanically rigid holder;
a curved emitter unit having an organic layer sequence for generating radiation; and
at least one bent electrical connection piece to which the emitter unit is electrically connected,
wherein the holder, the emitter unit and the connection piece are permanently mechanically fixedly connected to one another,
wherein the emitter unit and the connection piece are bent in regions of electrical contact regions,
wherein, at least in places, a bending radius of the emitter unit and of the connection piece is 20 mm or less, and
wherein at least the emitter unit and the connection piece each have at least one of a neutral axis and a neutral surface.

6. The organic light-emitting diode according to claim 5, wherein the organic light-emitting diode is at least one of a rear light or a brake light of a car, and wherein the organic light-emitting diode is configured to emit only red light during operation.

7. A method for producing a bent organic light-emitting diode, the method comprising:
providing an emitter unit having an organic layer sequence for generating radiation;
providing at least one electrical connection piece;
bending the at least one connection piece and the emitter unit into a curved shape; and
subsequently mechanically fixedly and permanently connecting the at least one connection piece to the emitter unit so that the curved shape is permanently maintained,
wherein the emitter unit has a plurality of electrical contact regions on a first main side,
wherein the connection piece is attached to the first main side so that the connection piece extends over all contact regions,
wherein bending comprises bending in a region of the contact regions, and
wherein the first main side is an emission region of the emitter unit.

8. The method according to claim 7,
wherein each the contact region has a main extension direction,
wherein the main extension directions of the different contact regions are oriented parallel to one another, and
wherein a bending curve is oriented parallel to the main extension direction in the region of the contact regions with a tolerance of at most 30°.

9. The method according to claim 7,
wherein each contact region has a main extension direction,
wherein the main extension directions of the different contact regions are oriented parallel to one another, and
wherein a bending curve is oriented perpendicular to the main extension direction in the region of the contact regions with a tolerance of at most 30°.

10. The method according to claim 7, wherein a bending radius between adjacent contact regions is greater than in the contact regions.

11. The method according to claim 7,
wherein the connection piece has at least one point with at least one of a recess or a reduced thickness, and
wherein the point is located between adjacent contact regions.

12. The method according to claim 7, wherein the contact regions are configured for a current spreading across the emission region and extend along at least one direction to at least 40% of a mean extent of the emission region beyond the latter.

13. The method according to claim 7,
wherein the contact regions are restricted to an edge region of the emitter unit, and
wherein a minimum bending radius is realized in the edge region with the contact regions.

* * * * *